(12) United States Patent
Szczyrbowski et al.

(10) Patent No.: US 6,743,341 B2
(45) Date of Patent: Jun. 1, 2004

(54) APPARATUS FOR APPLYING THIN LAYERS TO A SUBSTRATE

(75) Inventors: Joachim Szczyrbowski, Goldbach (DE); Götz Teschner, Hanau (DE); Jürgen Bruch, Hammersbach (DE)

(73) Assignee: Unaxis Deutschland Holding GmbH, Aschheim (DE)

( * ) Notice: Subject to any disclaimer, the term of this patent is extended or adjusted under 35 U.S.C. 154(b) by 61 days.

(21) Appl. No.: 10/127,332

(22) Filed: Apr. 22, 2002

(65) Prior Publication Data

US 2002/0157945 A1 Oct. 31, 2002

Related U.S. Application Data

(63) Continuation of application No. 08/818,789, filed on Mar. 14, 1997, now abandoned.

(30) Foreign Application Priority Data

Mar. 14, 1996 (DE) .......................................... 196 09 970

(51) Int. Cl.[7] ........................... C23C 14/34; C23C 16/00
(52) U.S. Cl. ............................ 204/298.03; 204/192.13; 204/298.07; 118/692
(58) Field of Search ....................... 204/192.13, 298.03, 204/298.07; 118/692

(56) References Cited

U.S. PATENT DOCUMENTS 4,752,361 A * 6/1988 Gautschi ...................... 205/784
5,292,417 A * 3/1994 Kugler .................. 204/192.13

FOREIGN PATENT DOCUMENTS

JP          62-211377        *  9/1987   ............ 204/298.03

OTHER PUBLICATIONS

Translation of 62–211377.*

* cited by examiner

*Primary Examiner*—Rodney G. McDonald
(74) *Attorney, Agent, or Firm*—Fulbright & Jaworski L.L.P.

(57) ABSTRACT

A process gas source (16) is connected to the vacuum chamber (5), and a metering valve (12) actuated by an automatic controller is installed between the vacuum chamber (5) and the process gas source (16). A potentiometric measurement electrode compares the amount of a gas in the vacuum chamber (5) with a reference gas by way of a reference electrode or with a solid body substituting for the reference electrode and sends a signal to automatic control unit (14), which contains a signal amplifier. The control unit then drives the generator of the power supply or the metering valve for the process gas.

7 Claims, 4 Drawing Sheets

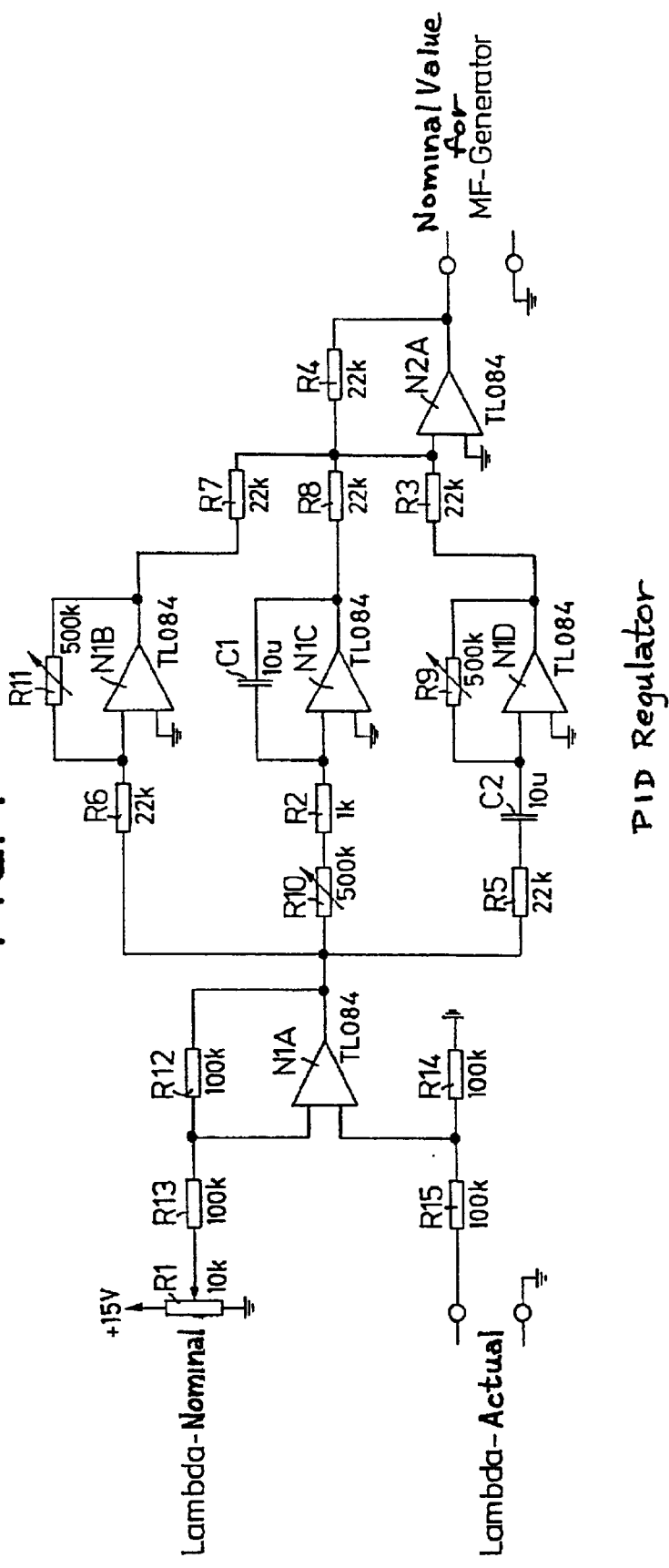

APPARATUS FOR APPLYING THIN LAYERS TO A SUBSTRATE

This application is a continuation of Ser. No. 08/818,789 filed on Mar. 14, 1997 now abandoned.

BACKGROUND OF THE INVENTION

The invention relates to an apparatus for applying thin layers to a substrate, by sputtering a cathode mounted target in a vacuum chamber.

To ensure a stable sputtering process at the desired working point, it is necessary to control the cathode power supply very precisely while keeping the gas feed constant. The simplest automatic control modes for this purpose are those based on current, voltage, and power. These automatic controls alone, however, are not sufficient to operate a sputtering cathode over a prolonged period of time in the critical region of the current-voltage characteristic (e.g., in the transition range between metallic mode and oxide mode).

It has therefore already been proposed that the amount of power be kept constant while the gas feed is automatically controlled with the help of a plasma emissions monitor (DD 271 827 13). In this known device for stabilizing operation, consisting of a plasma emissions monitor with a measurement system for converting an optical signal into an electrical signal and a common power supply with a switching device for pulsed operation of the plasmatron, each plasmatron has its own measuring system, the outputs of which are connected by way of holding stages to a superposition device. The switching device is connected by way of control stages to the superposition device, and on the output side the plasma emissions monitor and the valve for the reaction gas inlet are connected to the superposition device.

A method is known for monitoring the vapor deposition rate (DAS 27 00 979) and/or the composition of the material to be deposited during a vapor deposition process under vacuum in which a portion of the material to be vapor-deposited flows through a measurement zone, where the material to be vapor-deposited is exposed to radiation. The type of radiation is selected so that the electrons of at least some of the atoms of the material to be deposited flowing through the measurement zone are raised to a higher energy level. The photons created when the electrons fall back to the lower energy level are then recorded as a measure of the vapor deposition rate or as a signal providing information on the composition of the material to be vapor-deposited.

These known automatic control systems based on the use of a plasma emissions monitor or on the method according to DAS 27 00 979 are very expensive to produce, are very sensitive to reflections of foreign light, demand very precise adjustment, and are highly sensitive to uncontrolled dopings of the sputter gas.

These optical measurement methods also suffer from a decisive disadvantage in the case of systems which apply coatings under continuous operating conditions. Namely, they require a window to allow some of the light to pass through. This window is coated by stray vapor, as a result of which the optical properties of the window and thus the measurement values are changed.

SUMMARY OF THE INVENTION

The present invention avoids the disadvantages of the known automatic control apparatuses and in particular can be produced cheaply and operate reliably over a long period of time.

A measurement sensor, such as a potentiometric measurement electrode, compares the amount of a gas in the vacuum chamber or in a feed line connected to the vacuum chamber with a reference gas and sends the obtained signal or the potential difference being reached to the automatic control unit, which contains a signal amplifier. The control unit then drives the generator of the power supply.

BRIEF DESCRIPTION OF THE DRAWINGS

FIG. 4 is a circuit diagram of the amplifier unit for the generator.

DETAILED DESCRIPTION OF THE PREFERRED EMBODIMENT

Figure 1:
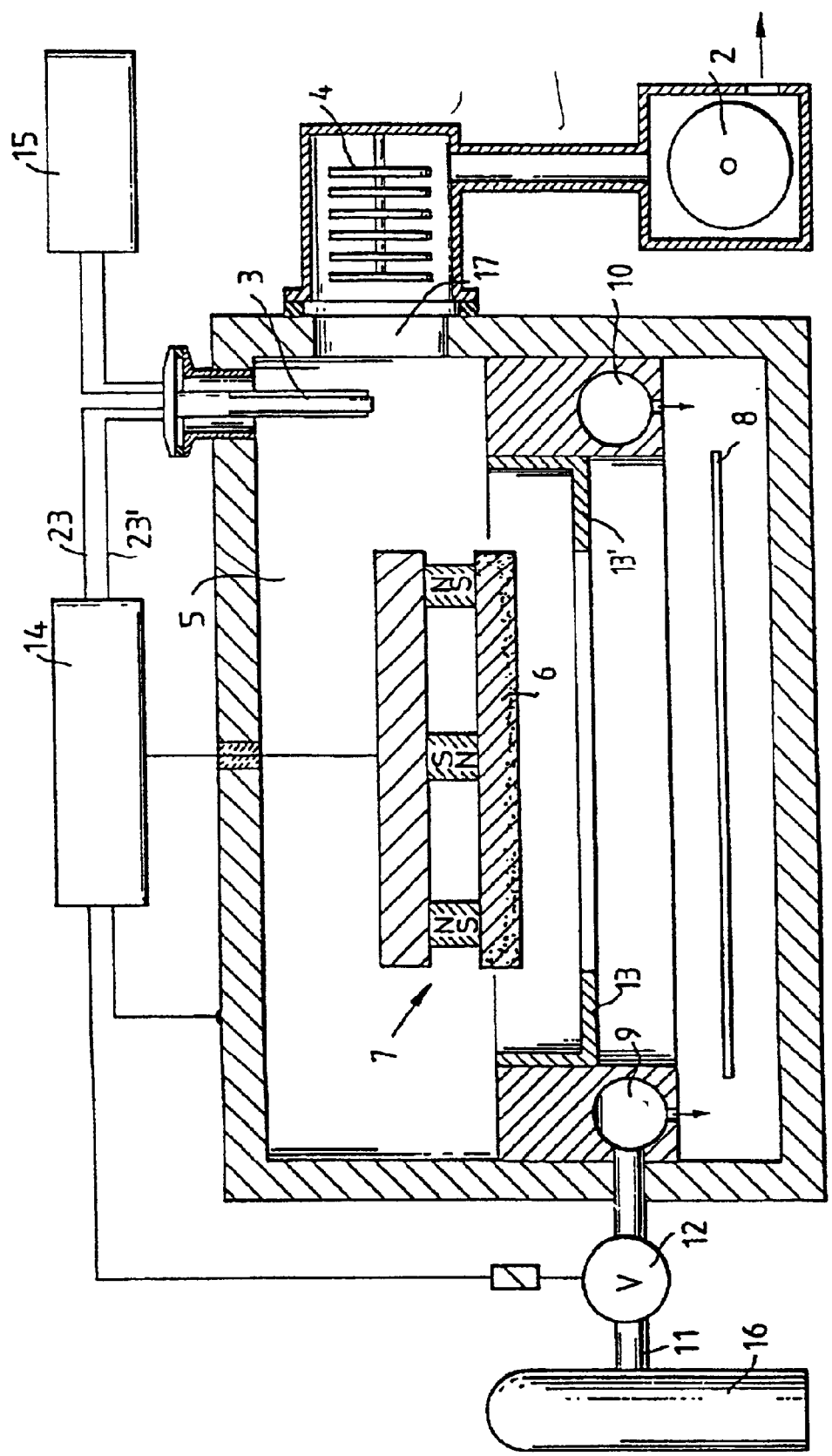
FIG. 1 is a diagrammatic cross section of a sputtering system with a magnetron cathode, a vacuum pump, a lambda probe, a process gas tank, and gas control valve, the lambda probe being located inside the vacuum chamber near the suction port of the vacuum pump.

The apparatus according to FIG. 1 consists essentially of a sputtering cathode 7 with a target 6, installed in a vacuum chamber 5; a substrate 8, mounted underneath target 6; gas channels 9, 10, one on each side of the cathode, with a gas inlet line 11, a gas supply tank 16, and a gas flow control valve 12; a diaphragm 13, 13'; a power supply with controller 14; a lambda probe 3 with a probe heater 15; and a vacuum pump 4 with an auxiliary pump 2.

A mixture of oxygen and argon may be provided from a single tank 16 through a single valve 12, or alternatively separate tanks and separate control valves for argon and oxygen can be provided.

Lambda probe 3 is installed directly in front of a turbo-molecular pump 4 near suction port 17. Target 6 consists of titanium and is sputtered in an argon-oxygen mixture, as a result of which a layer of $TiO_2$ is grown on substrate 8. Lambda probe 3 with a zirconium oxide electrolyte, which forms a good conductor for oxygen ions, is used to control the process.

The probe voltage is a function of the oxygen content of the gas being monitored. The oxygen partial pressure of the surrounding atmosphere forms the reference pressure. To eliminate any possible fluctuations in the probe voltage which may be caused by variations in atmospheric pressure and/or in the probe temperature, both values must be stabilized. The sputtering process is carried out at a constant oxygen flow rate.

The probe voltage is a function of the oxygen partial pressure in sputtering chamber 5 and serves to control the amount of power supplied by the cathode power supply.

Figure 2:
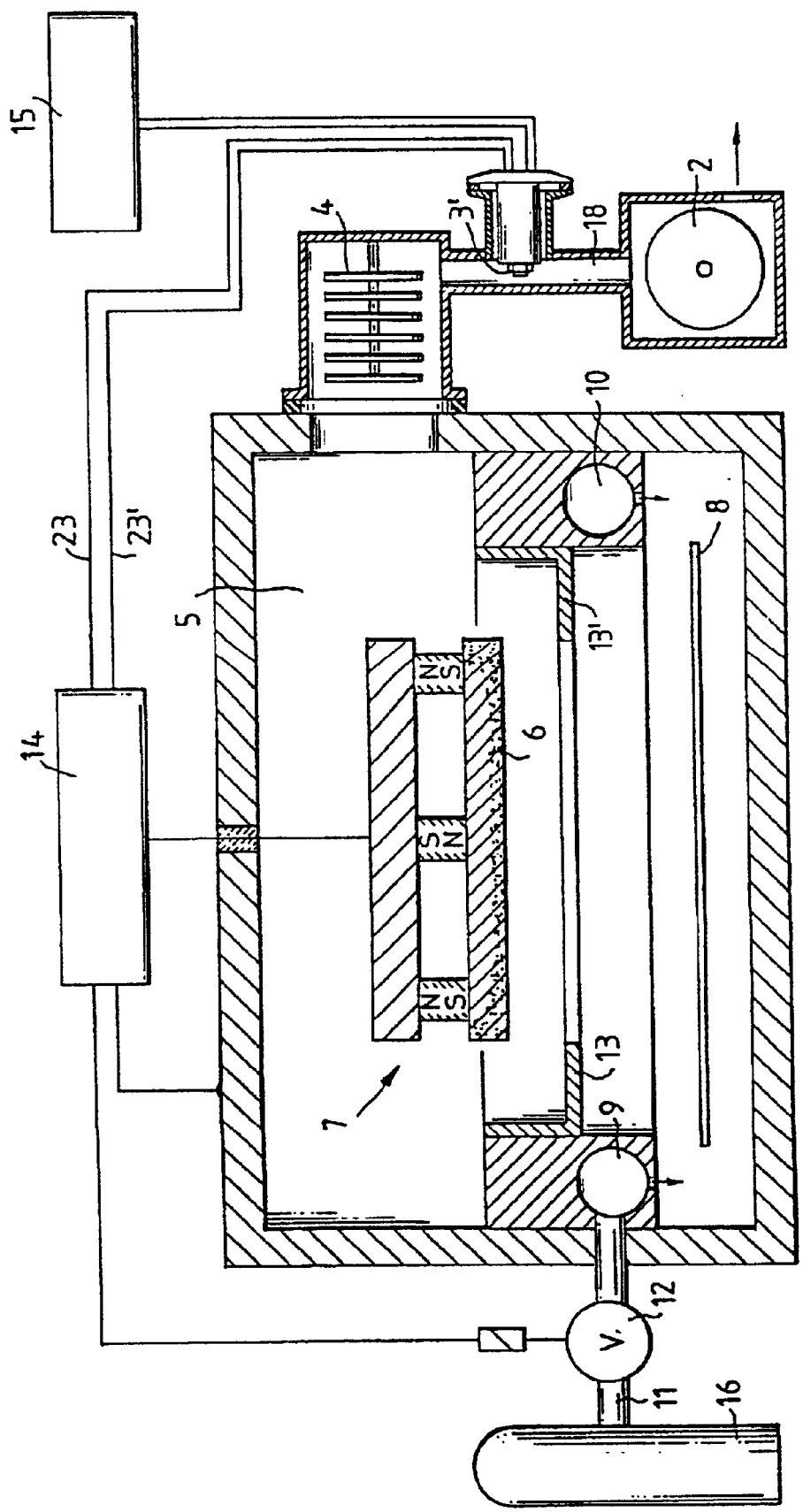
FIG. 2 is a diagrammatic cross section of a sputtering system with a main pump and a backing pump, the lambda probe being located in the connecting line between the two pumps.

The embodiment according to FIG. 2 differs from that of FIG. 1 only in that lambda probe 3' is inserted in connecting line 18 and therefore takes its measurements in a pressure region corresponding to the pressure in vacuum chamber 5.

Figure 3:
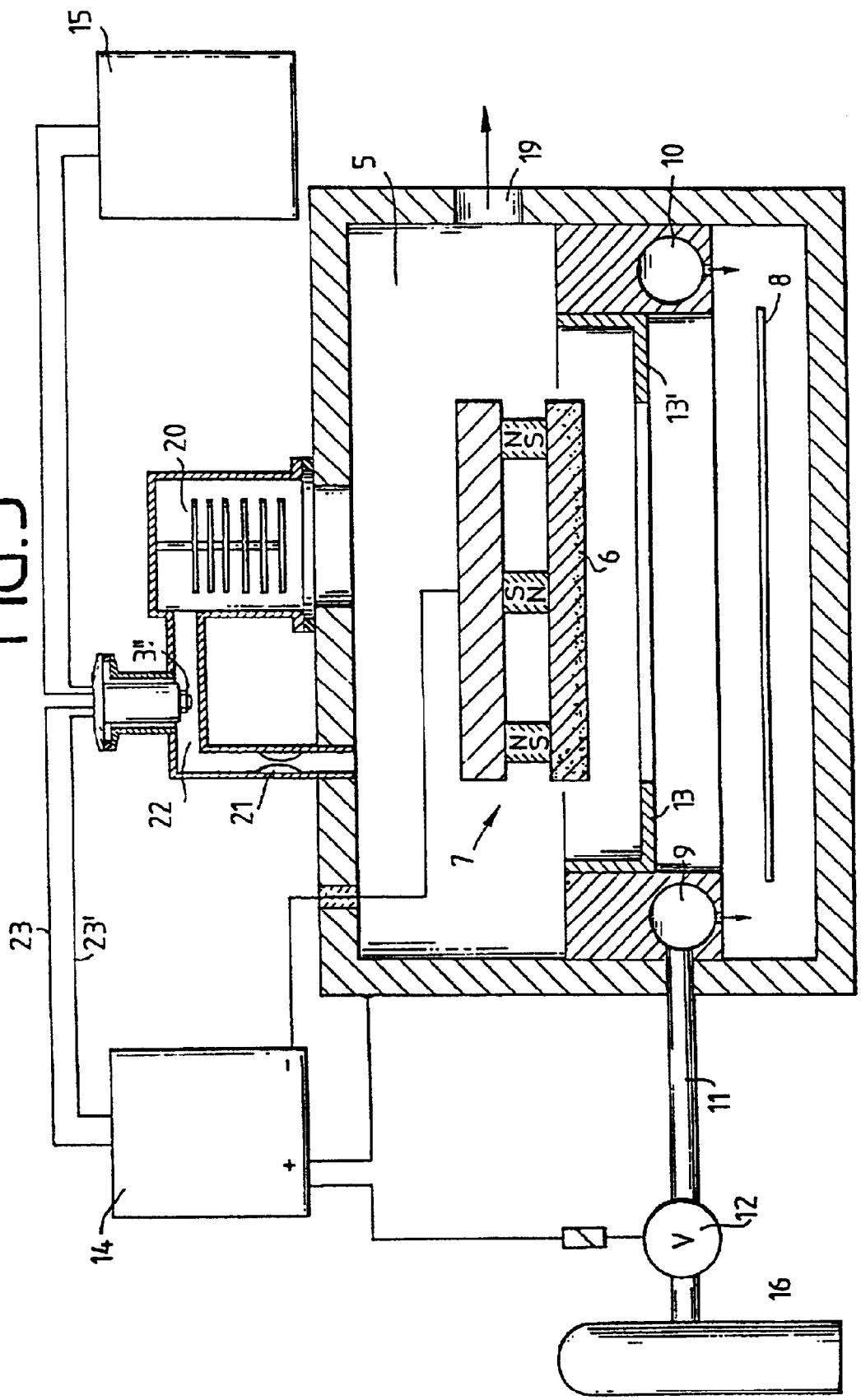
FIG. 3 is a diagrammatic cross section of a system with an additional vacuum pump, the suction and delivery sides of which are connected to the vacuum chamber, a throttle valve and the lambda probe being installed in the delivery line of the pump.

The embodiment according to FIG. 3 has a lambda probe 3", which is connected to a pressure line 22 of a vacuum pump 20 connected to vacuum chamber 5, solely for the purpose of increasing gas pressure to facilitate measuring the partial pressure of oxygen in an oxygen argon mixture. A throttle valve 21 is installed in this pressure line. Lambda probe 3″ is located between the vacuum pump and the throttle valve. The vacuum chamber is evacuated through separate port 19.

FIG. 4 shows the amplifier, combined into a unit 14, located between the generator which supplies power to cathode 7 and lambda probe 3, 3′, 3″. This amplifier receives the signal coming from lambda probe 3, 3′, 3″ over line 23, 23′ and also supplies the control current to the generator, such as an MF-generator.

The ratio of electrical power to oxygen is always essential to the stability of the sputtering process. The signal from the lambda probe can therefore be used to regulate the flow of oxygen while the power is kept constant, or to regulate the electrical power. While the gas flow is kept constant by means of a volume regulator.

The circuit depicted in FIG. 4 compares the nominal and actual values, and generates a difference signal for a PID-controller (proportional-integral-differential regulator). This in turn supplies a signal for the medium frequency generator (power supply) or for the gas supply.

What is claimed is:

1. An apparatus for coating a substrate, said apparatus comprising:
   a vacuum chamber,
   a vacuum pump having a suction port connected to said vacuum chamber,
   a process gas source connected to said vacuum chamber by a process gas supply line having a metering valve,
   a lambda probe for directly determining the partial pressure of said process gas in said vacuum chamber and generating a signal representing said partial pressure, wherein said lambda probe is positioned in a vacuum atmosphere in said apparatus, and
   control means for regulating at least one of said metering valve and said power supply based on said signal.

2. The apparatus of claim 1, wherein said lambda probe is positioned proximate to said suction port.

3. The apparatus of claim 1, wherein said vacuum pump comprises a main pump and an auxiliary pump with a connecting line therebetween.

4. An apparatus for coating a substrate, said apparatus comprising:
   a vacuum chamber;
   a vacuum pump having a suction port connected to said vacuum chamber, said vacuum pump comprising a main vacuum pump and an auxiliary vacuum pump, wherein said main vacuum pump and said auxiliary vacuum pump are connected by a connecting line therebetween;
   a process gas source connected to said vacuum chamber by a process gas supply line having a metering valve;
   a lambda probe in said connecting line to determine a partial pressure of the process gas, said lambda probe generating a signal representing the partial pressure of the process gas; and
   a control unit operatively connected to said lambda probe for regulating at least one of said metering valve and said power supply based on said signal.

5. An apparatus for coating a substrate, said apparatus comprising:
   a vacuum chamber,
   a vacuum pump having a suction port connected to said vacuum chamber,
   a process gas source connected to said vacuum chamber by a process gas supply line having a metering valve,
   a lambda probe for directly determining the partial pressure of said process gas in said vacuum chamber and generating a signal representing said partial pressure, wherein said lambda probe is positioned in a vacuum atmosphere in said apparatus, and
   a control unit for regulating at least one of said metering valve and said power supply based on said signal.

6. The apparatus of claim 5, wherein said lambda probe is positioned proximate to said suction port.

7. The apparatus of claim 5, wherein said vacuum pump comprises a main pump and an auxiliary pump with a connecting line therebetween.

* * * * *